United States Patent [19]

Cheung et al.

[11] Patent Number: 4,762,805
[45] Date of Patent: Aug. 9, 1988

[54] NITRIDE-LESS PROCESS FOR VLSI CIRCUIT DEVICE ISOLATION

[75] Inventors: Robin W. Cheung, Cupertino; Hugo W. K. Chan, Fremont, both of Calif.

[73] Assignee: Advanced Micro Devices, Inc., Sunnyvale, Calif.

[21] Appl. No.: 810,397

[22] Filed: Dec. 17, 1985

[51] Int. Cl.$^4$ .......................................... H01L 21/475
[52] U.S. Cl. ...................................... 437/63; 437/982; 437/984
[58] Field of Search ............ 148/DIG. 43; 156/659.1; 437/63; 437/982, 984

[56] References Cited

U.S. PATENT DOCUMENTS

| | | | |
|---|---|---|---|
| 4,282,648 | 8/1981 | Yu et al. | 29/571 |
| 4,409,319 | 10/1983 | Colacino et al. | 430/296 |
| 4,471,522 | 9/1984 | Jambotkar | 29/571 |
| 4,573,257 | 3/1986 | Hulseweh | 29/576 E |
| 4,605,470 | 8/1986 | Gwozdz et al. | 156/643 |

FOREIGN PATENT DOCUMENTS 0078437 5/1983 Japan ................................ 29/576 W Primary Examiner—Olik Chaudhuri
Attorney, Agent, or Firm—Patrick T. King; Eugene H. Valet; Mark E. Miller

[57] ABSTRACT

An integrated circuit fabrication technique for constructing field isolation structure components and subposing electrical barrier isolation region components in a substrate is disclosed. A nitride-less mask is used to pattern a major surface of the substrate with apertures where the isolation barrier components are to be implanted. Following the formation of the isolation components, a thick oxide is formed on the substrate, masked, and etched to form field oxide structures on the major surface of the substrate. Bird beaks, bird crests, crystalline dislocations and white ribbon problems associated with nitride masking processes are virtually eliminated.

11 Claims, 5 Drawing Sheets

NITRIDE-LESS PROCESS FOR VLSI CIRCUIT DEVICE ISOLATION

BACKGROUND OF THE INVENITON

1. Field of the Invention

The present invention generally relates to the fabrication of integrated circuits and, in particular, to a process for forming electrical isolation components of an integrated circuit.

2. Description of the Related Art

As semiconductor integrated circuit fabrication technology advances into the realm of very large scale integration (VLSI), new techniques must be developed to eliminate process deficiencies which were acceptable for devices having less dense configurations.

One area of concern is that of electrical isolation; i.e., the separation of individual active regions in the major surface of the semiconductor substrate and superposing structures by an insulator or dielectric component which will prevent undesirable electrical interaction.

A common technique for obtaining electrical isolation between adjacent active regions in an integrated circuit structure is the use of silicon dioxide regions, commonly referred to as "field oxide," or "isolation oxide," depending upon the exact usage in the integrated circuit structure. This fabrication process is commonly referred to as LOCOS—local oxidation of silicon. In metal-oxide-semiconductor (MOS) field effect transistor (FET) based devices, electrical isolation barrier regions formed in the substrate below a field oxide are also referred to as "channel stop" regions.

The LOCOS process is based on the fact that silicon nitride ("nitride") can be used as a mask against thermal oxidation of silicon because its oxidation rate is about 30 times slower than silicon. Additionally, silicon nitride can be selectively etched.

In such a process, isolation oxide is typically grown to a thickness such that the top of the oxide and the silicon substrate surface are in the same plane to minimize surface topography. U.S. Pat. No. 3,970,486 (Kooi) describes a LOCOS method for forming discrete oxide regions in a semiconductor surface.

However, as shown in FIG. 1, at the periphery of the active silicon areas, "bird's beaks" (resulting from lateral oxidation under masking materials) and "bird's crests" or "heads" (vertical rising at the corners of the etched silicon) are formed when nitride masking is used. These effects are not desirable. A bird's beak takes up lateral space. A bird's head produces greater surface topography, adding step coverage requirements for subsequently formed layers such as metal interconnections. Neither effect is acceptable in VSLI technology. In particular, long bird's beaks are clearly counterproductive to device shrinkage.

A second problem exists because of the extremely poor thermal expansion coefficient match between silicon nitride masks and the underlying silicon. One result is the formation of dislocations in the crystalline structure of unoxidized silicon regions. Such dislocations can cause junction leakages.

Yet another problem with nitride processes is called "white ribbon" or "browning." During the relatively high temperature cycles required, ammonia-nitride compounds are formed at silicon interfaces with the nitride. During subsequent fabrication steps, these tend to form voids in the structure which can cause, for example, electrical shorts at FET gate regions. Wet chemical cleaning or wet thermal oxidation processing, or both, are required to remove these compounds.

Hence, there is a need for a simple approach to forming electrical isolation components during integrated circuit fabrication to reduce or eliminate the problems in the prior art without inheriting process complexities.

Although the present invention is useful for many integrated circuit technologies, it is particularly advantageous for high density, high performance static random access memory (SRAM) device construction because of the very tight spacing and the narrow transistor width effect requirements.

SUMMARY OF THE INVENTION

It is an object of the present invention to provide a semiconductor integrated circuit process technique for the formation of electrical isolation or barrier components which eliminates the need for nitride masking steps.

It is another object of the present invention to provide a method for forming local oxidation regions in semiconductor integrated circuits which eliminates problems associated with the use of silicon nitride masks, such as the formation of ammonia compounds, bird beak and bird crest formations, and physical disruption of th crystalline structure of substrate regions.

It is a further object of the present invention to provide a method of forming electrical isolation components of an integrated circuit which is amenable to the formation of sublithographic components.

It is yet a further object of the present invention to provide a method for allowing the formation of VLSI narrow width transistors without the inherent effects of prior art nitride masking techniques.

In its basic aspect, the present invention is a nitride-less fabrication technique for forming electrical isolation components in an integrated circuit structure. A relatively thin buffer, or screening, layer is formed on a major surface of a semiconductor material substrate where the integrated circuit is to be constructed. A patterned mask, such as of photoresist, is formed on the screening layer, defining areas of the substrate surface where isolation barrier components are to be constructed. The region of the substrate subjacent said area is doped to have a conductivity which is the same as that of the subjacent substrate region. The patterned mask is then removed. A relatively thick layer of an insulator material is formed on the substrate. Another patterned mask is formed, defining areas of the substrate where active device regions are yet to be formed. The insulator material is then removed according to the second mask to leave insulator material superposing said doped region and adjacent substrate surface areas.

It is an advantage of the present invention that no silicon nitride, with its inherent disadvantages, need be employed in any of the process steps.

It is another advantage of the present invention that it provides a method of forming electrical isolation barriers in a semiconductor which can have sublithographic dimensions.

It is yet another advantage of the present invention that the steps are performed at relatively low temperatures, reducing thermal diffusion effects and molecular stress effects such as crystalline dislocations, hence resulting in higher manufacturing yield of operable die.

It is a further advantage of the present invention that the process can be used to form a MOS channel stop region which is relatively distant from adjacent active device regions, allowing narrow transistor widths.

Other objects, features and advantages of the present invention will become apparent upon consideration of the following detailed description and the accompanying drawings, in which like reference designations represent like features throughout the FIGURES.

BRIEF DESCRIPTION OF THE DRAWINGS

FIGS. 2 through 7 are cross-sectional schematic drawings showing a sequence of idealized process steps in accordance with the present invention, in which FIG. 2 shows a substrate having doped well regions onto which a thin layer of an insulator material has been formed;

FIG. 3 shows the structure of FIG. 2 after step completion in which a patterned mask has been formed;

FIG. 4 shows the structure of FIG. 3 wherein an implant to form an isolation component in a well region is performed;

FIG. 5 shows the structure of FIG. 4 after step completion in which the mask has been removed and a thick insulator material and superjacent mask have been formed;

FIG. 6 shows the structure of FIG. 5 after step completion in which the thick insulator material has been etched and the superjacent mask has been removed; and FIG. 7 shows a cross-sectional view of several isolation components formed in accordance with the present invention;

The drawings referred to in this description should be understood as not being drawn to scale except if specifically noted. Moreover, the drawings are intended to illustrate only one portion of an integrated circuit fabricated in accordance with the present invention.

DETAILED DESCRIPTION OF THE INVENTION

Reference is made now in detail to a specific embodiment of the present invention, which illustrates the best mode presently contemplated by the inventors for practicing the invention. Alternative embodiments are also briefly described as applicable.

It should be recognized that many publications describe the details of common techniques used in the fabrication process of integrated circuit components. See, e.g. *Semiconductor & Integrated Circuit Fabrication Techniques,* Reston Publishing Co., Inc., copyright 1979 by the Fairchild Corporation. Those techniques can be generally employed in the fabrication of the structure of the present invention. Moreover, the individual steps of such a process can be performed using commercially available integrated circuit fabrication machines. As specifically helpful to an understanding of the present invention, approximate technical data are set forth based upon current technology. Future developments in this art may call for appropriate adjustments as would be obvious to one skilled in the art.

Figure 1A:
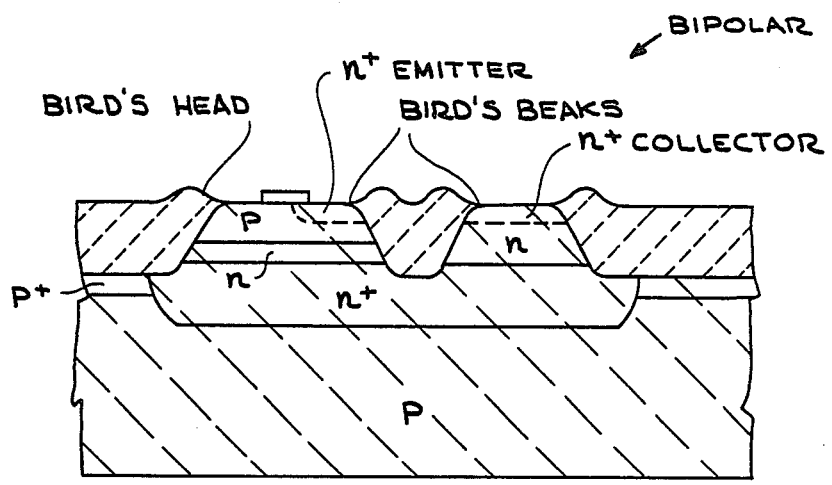
FIGS. 1a and 1b are cross-sectional views of typical integrated circuit device structures of the prior art, demonstrating the bird beak and bird crest phenomena.
Figure 1B:
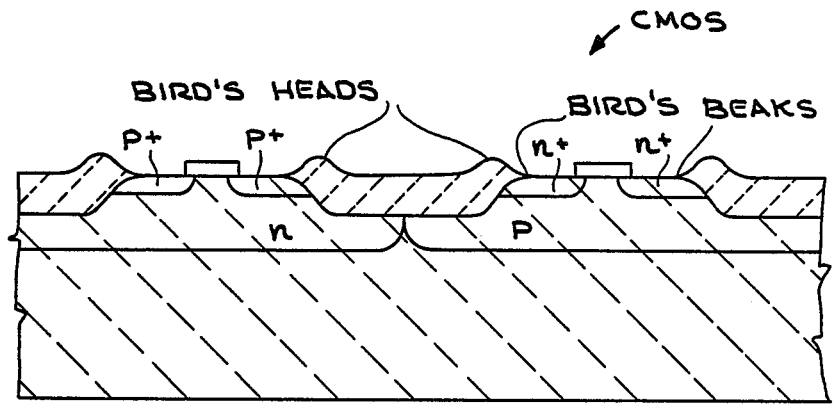
Figure 2:
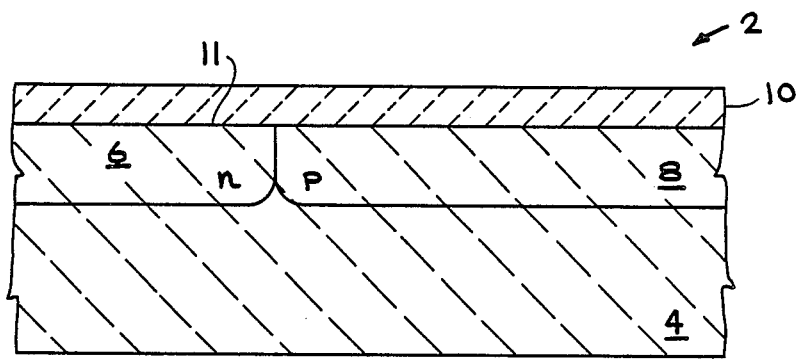

FIG. 2 depicts a semiconductor wafer substrate 4, such as, for example, a commercially available, high resistivity, crystalline silicon wafer. In accordance with well known processes, a well region 6 having an n-type conductivity doping, and a well region 8 having a p-type conductivity doping, have been formed.

Using conventional techniques, a relatively thin screening layer 10 is formed. In the present embodiment, a silicon dioxide layer having a thickness of approximately 400 to 1000 Angstroms is formed by thermal oxidation of the silicon substrate 4 major surface 11.

Figure 3:
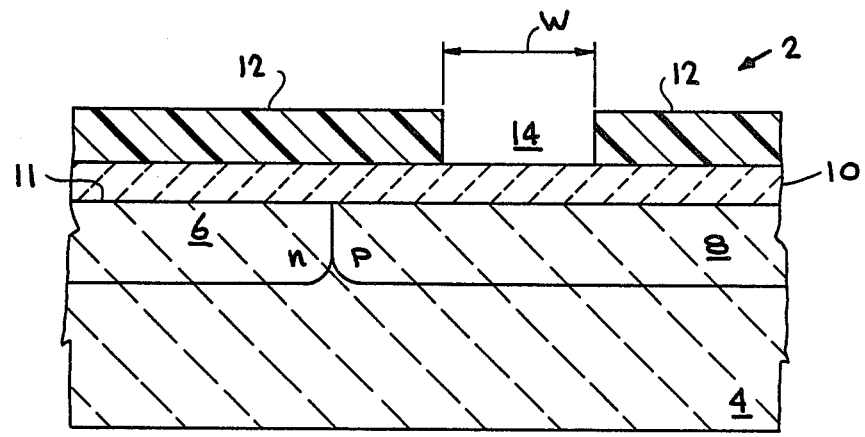

Next, as shown in FIG. 3, a photoresist mask 12 is formed to define a region of each of the p-wells 8 (one shown) where an electrical isolation barrier component is to be formed. Using commonly known techniques, a mask 12 of approximately 1.2 microns can be formed. The width, w, of the patterned mask apertures 14 should be the smallest that current lithography machines will allow, approximately 1.2 microns.

Figure 4:
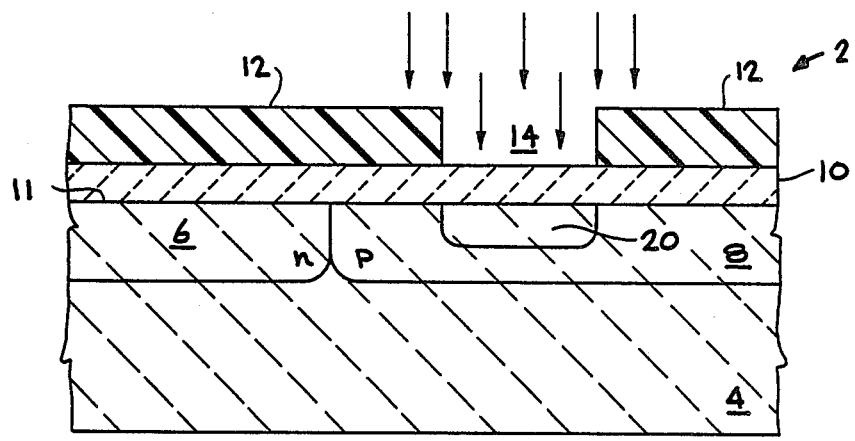

Referring now to FIG. 4, impurities are introduced into the p-well through the apertures 14 in the mask 12. For example, boron ions can be implanted using commercial ion implant machines. The required implant energy will depend on the thicknesses of the screening layer 10 and mask 12. Typically, it will be in the range of approximately 70 to 120 eV. A dosage of, for example, approximately $6 \times 10^{12}$ will result in an isolation barrier component 20 having a concentration of approximately $5 \times 10^{16}$. The photoresist mask 12 is then removed.

Figure 5:
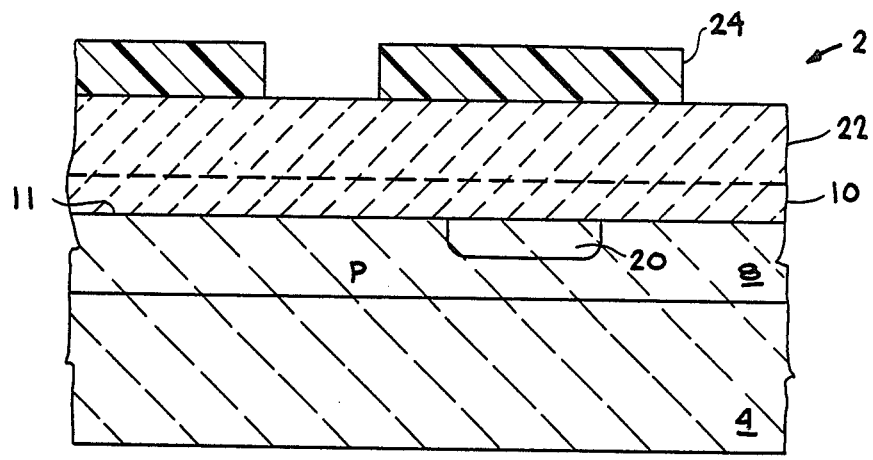

The next step of the process is to form field isolation insulator component regions on the surface 11 of the substrate 4. As depicted in FIG. 5, a relatively thick layer 22 of silicon dioxide is formed. Using a low temperature deposition to a thickness of approximately 3000 to 5000 Angstroms will result in less lateral diffusion of the isolation region 20 than other, higher temperature methods. The screening silicon dioxide 10 is absorbed into layer 22 as indicated by the broken line.

Figure 6:
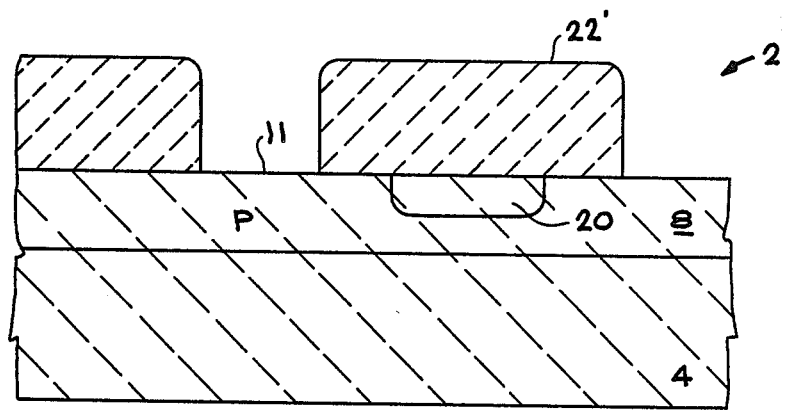

The thick oxide layer 22 is then masked, again using common photoresist 24, in a pattern which will define the active device regions yet to be formed in the wells 6, 8. The mask 24 is then used to etch the thick oxide layer 22 down to the surface 11 of the substrate 4, as demonstrated in FIG. 6, to form spaced field oxide regions 22′. Conventional wet or dry etching techniques can be used.

Figure 7:
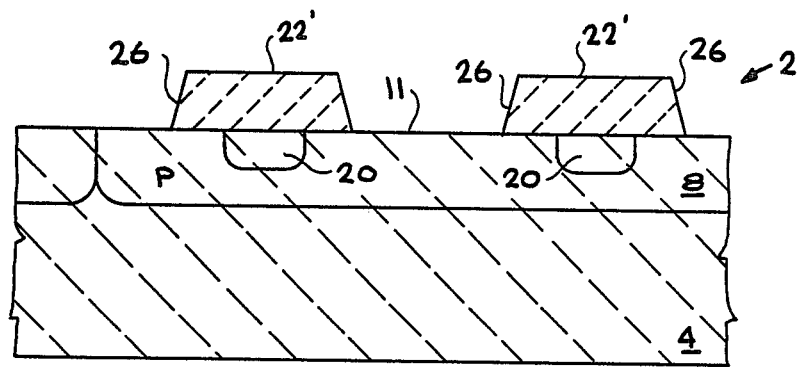

As shown in an expanded view in FIG. 7, the sidewalls 26 of the field oxide regions 22′ can have a sloped configuration in order to facilitate step coverage of subsequent layers.

The structure 2 is at this point prepared for the continuation of processes to form the remainder of the integrated circuit.

Figure 8:
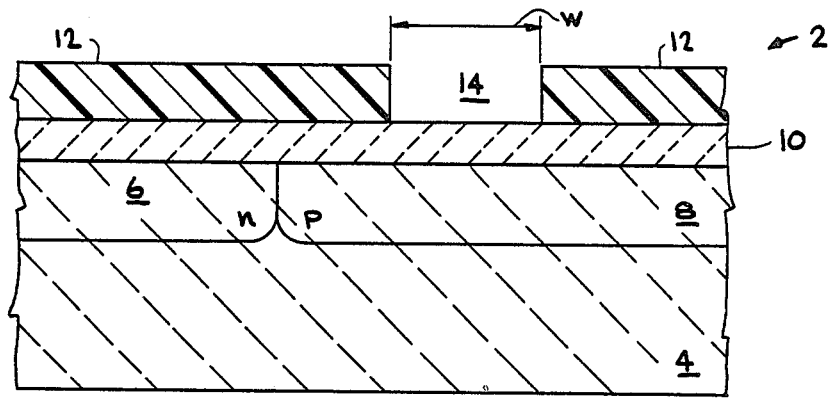
FIGS. 8 and 9 are cross-sectional schematic drawings of steps of an alternative embodiment for the formation steps depicted in FIG. 3 using a photoresist reflow technique for forming a patterned mask having sublithographic dimensions.

To improve alignment factors, alternative steps can be added to the present invention. Referring to FIG. 8, the steps of the inventive method have been performed as described above to the step where the structure 2 is ready to receive the dopant implant which will form the isolation component 20.

Figure 9:
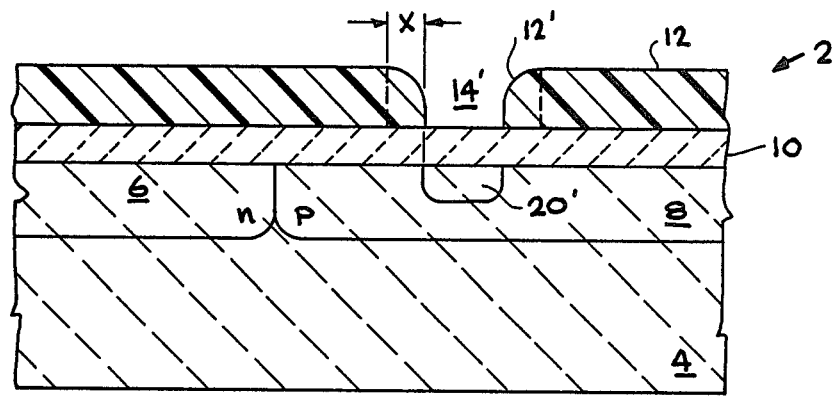

A soft-baking of the structure at approximately 115 degrees centigrade will cause a "resist reflow" 12′ to occur. The reflow will cause the mask 12 to extend into the aperture 14 by an amount designated x. After the reflow, the minimum width of the aperture 14 allowed using stepper lithography is reduced to an aperture 14' having a width=$w-2x$, as shown in FIG. 9.

The subsequent dopant implant, therefore, will provide a narrower isolation barrier region 20' than was achieved relying only on the capability of the commercial fabrication machine. The isolation region 20' formed will also have the same concentration for the same implant parameters. Later heat treatment cycles of circuit fabrication steps will cause less spreading of such a region 20'.

Figure 10:
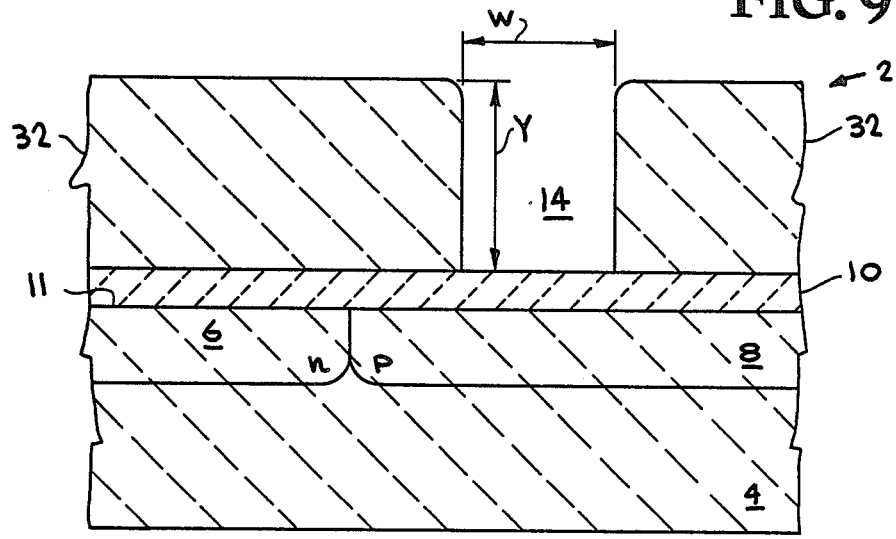
FIGS. 10 and 11 are cross-sectional schematic drawings of steps of an alternative embodiment for the formation steps of the mask as shown in FIG. 3.
Figure 11:
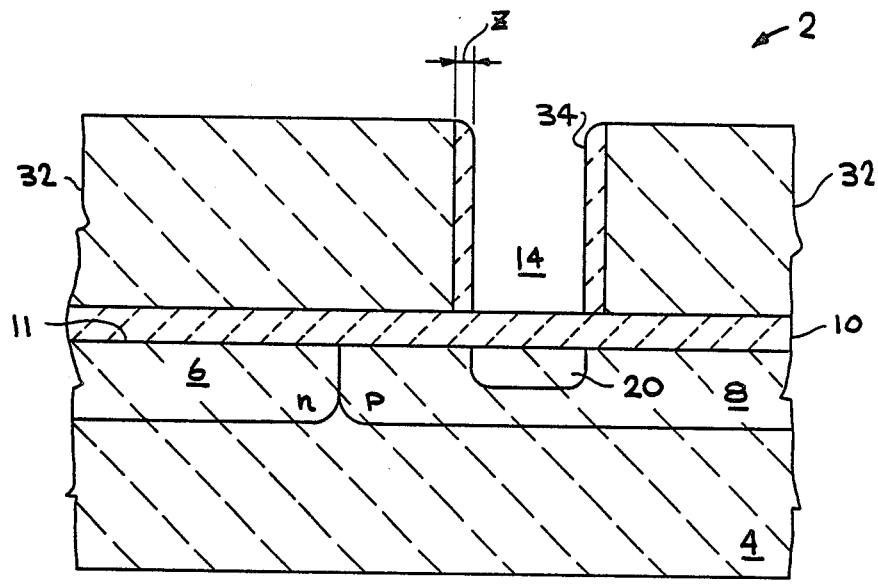

An alternative method of narrowing the isolation barrier region 20 is shown in FIGS. 10 and 11. Rather than forming the photoresist mask 12 as shown in FIG. 3, a thick layer 32, having a height y, is formed on the screening oxide 10. For example, this layer 32 can be silicon dioxide or polysilicon or even silicon nitride. (Note, however, no oxidation step is employed which would cause the undesirable stress problems noted earlier.) The thick layer 32 is patterned to the minimum stepper width w. A low temperature oxide layer, having a selective etch rate over said thick layer 32, is formed and a conventional spacer etch back method is used to leave only oxide 34, having a width z, lining the aperture 14 as shown in FIG. 11. Thus, the minimum width of the aperature 14 allowed using stepper lithography is reduced to an aperture 14' having a width=$w-2z$, as shown in FIG. 11. After the implant of the isolation barrier region 20, the narrowing promoter layers can be removed and the fabrication of the chip continued.

Figure 12:
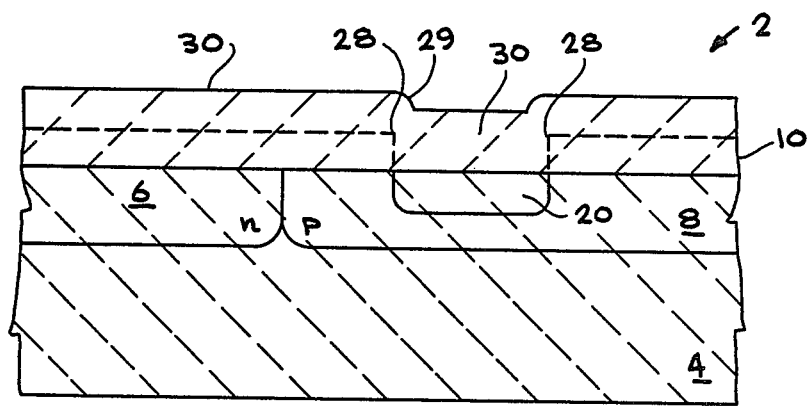
FIG. 12 is a cross-sectional schematic drawing of steps of an alternative embodiment step for the formation of alignment marks for forming a patterned mask as shown in FIG. 5.

Additional steps which may be taken to improve alignment of subsequent implants to the field oxide regions 22' which have been formed in accordance with the present invention are demonstrated in FIG. 12.

After the dopant implant, the mask 12 as shown in FIG. 3 is used to etch the screening oxide 10 down to the substrate surface 11. The mask 12 is then stripped from the structure 2. A low temperature silicon dioxide layer 30 is then formed as shown in FIG. 12. Because of the steps 28 in the etched screening oxide 10, the oxide 30 will have small steps 29 which can be used as alignment markers for the processes, such as the source and drain region masking.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other technologies, such as with other MOS or even bipolar processes. Similarly, any process steps described might be interchangeable with other steps in order to achieve the same result. The embodiment was chosen and described in order to best explain the principles of the invention and its practical application to thereby enable others skilled in the art to understand the invention for various embodiments and with various modifications as are suited to the particular use contemplated. It is intended that the scope of the invention be defined by the claims appended hereto and their equivalents.

What is claimed is:

1. In an integrated circuit fabrication process, a method of forming electrical insulation components in an integrated circuit having a semiconductor substrate, comprising:
    forming a first insulator layer on said substrate;
    forming a first mask on said layer to define a pattern of surface areas of said substrate beneath said insulator layer where isolation barrier components are to be formed;
    introducing impurities into said surface areas to form said isolation barrier components in said substrate subjacent said surface areas;
    removing said first mask
    forming a second insulator layer on said first insulator layer;
    forming a second mask on said second insulator layer to define a pattern of surface areas of said substrate where active device regions are to be formed; and
    removing said second insulator layer from said substrate according to said second mask pattern to form field isolation insulator components on said substrate.

2. The method as set forth in claim 1, wherein the step of forming a first mask further comprises:
    using a nitride-less material to form said first mask.

3. The method as set forth in claim 2, wherein the step of forming a first mask further comprises:
    forming a mask of photoresist material, defining a pattern of apertures, on said first insulator layer; and
    heat treating said mask to cause said photoresist material to flow partially into said apertures, whereby the area defined by said mask is less than the area prior to said heat treating.

4. The method as set forth in claim 1, wherein said step of removing said first mask further comprises the steps of:
    etching said insulator layer in accordance with said first mask pattern;
    removing said mask; and
    forming a layer of material on said first insulator layer which will have a conformal topography.

5. The method as set forth in claim 1, wherein said step of forming a first mask further comprises:
    forming a layer of a first insulator material, having a first etch rate characteristic, on said first insulator layer;
    etching said layer of first insulator material to define a pattern of apertures superposing said areas;
    forming a layer of a second insulator material, having a second etch rate characteristic selective over said first etch rate, on said layer of said first insulator material;
    etching said second insulator material until only aperture lining regions of said second insulator material remain, whereby the area defined by said mask is less than the area defined by said layer of said first insulator material.

6. The method as set forth in claim 5, wherein said step of forming the first insulator material further comprises:
    forming the first insulator layer of material selected from a group consisting of silicon dioxide, polysilicon, and silicon nitride.

7. The method as set forth in claim 6, wherein said step of forming a layer of a second insulator material further comprises:
    depositing silicon dioxide.

8. An integrated circuit fabrication process of forming field isolation structures and electrical barrier isolation regions for a silicon-based semiconductor substrate, comprising:

forming a first silicon dioxide layer on a major surface of said substrate;

forming a first mask of nitride-less material on said first silicon dioxide layer, said first mask having a pattern which defines areas of said surface beneath which said barrier isolation components are to be formed subjacently in said substrate;

introducing impurities into said substrate according to said mask pattern to form said barrier isolation components;

removing said first mask;

forming a second silicon dioxide layer on said first silicon dioxide layer;

forming a second mask on said second silicon dioxide layer, said second mask having a pattern which defines areas of said surface, adjacently spaced from said isolation barrier regions, where active device regions of said integrated circuit are to be formed; and etching said second silicon dioxide layer in accordance with said second mask pattern, whereby field oxide isolation structures superposing said electrical barrier isolation regions remain on said surface.

9. The method as set forth in claim 8, wherein the step of forming a first mask further comprises:

forming a mask of photoresist material, having a pattern of apertures, on said first silicon dioxide layer; and heat treating said mask to cause said photoresist material to flow partially into said apertures, whereby each area defined by said mask is less than the area defined prior to said heat treating.

10. The method as set forth in claim 8, wherein said step of removing said first mask further comprises the steps of:

etching said first silicon dioxide layer in accordance with said first mask pattern;

removing said mask; and forming a third silicon dioxide layer on said first silicon dioxide layer whereby said third silicon dioxide layer provides alignment marks for subsequent process steps.

11. The method as set forth in claim 8, wherein said step of forming a first mask further comprises:

forming a layer of a first insulator material, having a first etch rate characteristic, on said first silicon dioxide layer;

etching said layer of first insulator material to define a pattern of apertures superposing said areas;

forming a layer of a second insulator material, having a second etch rate characteristic selective over said first etch rate, on said layer of said first insulator material;

etching said second insulator material until only aperture lining regions of said second insulator material remain, whereby the area defined by said mask is less than the area defined by said layer of said first insulator material after said etching of said layer of said first insulator material.

* * * * *